(12) United States Patent
Roy et al.

(10) Patent No.: US 6,434,003 B1
(45) Date of Patent: Aug. 13, 2002

(54) LIQUID-COOLED POWER SEMICONDUCTOR DEVICE HEATSINK

(75) Inventors: Steven N. Roy, York; John F. Judge, Stewartstown; Harold R. Schnetzka, York, all of PA (US)

(73) Assignee: York International Corporation, York, PA (US)

( * ) Notice: Subject to any disclaimer, the term of this patent is extended or adjusted under 35 U.S.C. 154(b) by 0 days.

(21) Appl. No.: 09/840,058

(22) Filed: Apr. 24, 2001

(51) Int. Cl.$^7$ ................................................ H05K 7/20
(52) U.S. Cl. ........................ 361/699; 361/698; 361/701; 361/702; 361/704; 361/711; 257/714; 174/15.1; 165/80.4; 165/104.22; 165/104.33
(58) Field of Search ................................ 361/689–694, 361/696–699, 702, 711; 257/714, 721; 174/15.1, 16.1, 16.3; 165/80.3, 80.4, 104.33

(56) References Cited

U.S. PATENT DOCUMENTS

| | | | | |
|---|---|---|---|---|
| 4,628,991 A | * | 12/1986 | Hsiao et al. ................ | 165/80.4 |
| 5,203,401 A | * | 4/1993 | Hamburgen et al. ....... | 165/80.4 |
| 5,293,070 A | * | 3/1994 | Burgess et al. ............. | 257/714 |
| 5,316,075 A | * | 5/1994 | Quon et al. ................. | 165/80.4 |
| 5,463,528 A | * | 10/1995 | Umezawa .................... | 361/699 |
| 5,539,617 A | * | 7/1996 | Bochler ....................... | 361/699 |
| 5,675,473 A | * | 10/1997 | McDunn et al. ............ | 361/699 |
| 6,034,872 A | * | 3/2000 | Chrysler et al. ............ | 361/699 |
| 6,124,632 A | * | 9/2000 | Lo et al. ..................... | 257/678 |
| 6,257,320 B1 | * | 7/2001 | Wargo ......................... | 165/80.4 |

\* cited by examiner

*Primary Examiner*—Boris Chervinsky
(74) *Attorney, Agent, or Firm*—McNees Wallace & Nurick LLC; Brian T. Sattizahn; Carmen Santa Maria

(57) ABSTRACT

The present invention relates to a cold plate for cooling electronic components comprising a base having a top surface onto which at least one electronic component is to be placed; a cooling well formed in the top of the base and open at the top; a feed channel formed in the base for carrying fluid into the cooling well; a drain channel formed in the base for carrying cooling fluid away from the cooling well; cooling well inlets and outlets formed in the cooling well and in communication with the feed channel and drain channels, respectively. The feed and drain channels are sufficiently large relative to the size and flow characteristics of the well and cooling well inlets and outlets such that when the cooling fluid flows through the device, the pressure drop across the feed channel is substantially less than the pressure drop across the well.

28 Claims, 6 Drawing Sheets

LIQUID-COOLED POWER SEMICONDUCTOR DEVICE HEATSINK

DESCRIPTION OF THE INVENTION

1. Field of the Invention

The present invention generally relates to heatsinks for cooling power electronic devices, especially devices used to provide power to an induction motor in an HVAC system. More particularly, this invention relates to a heatsink whereby cooling fluid comes in direct contact with the device to be cooled via a system of channels and wells over which the device is mounted.

2. Background of the Invention

Power electronic devices such as insulated gate bipolar transistors (IGBTs) and silicon-controlled rectifiers (SCRs) are typically cooled by mounting the devices within a housing which is secured to a heatsink or "cold plate". Cold plates are typically formed from a material which is highly thermally conductive, such as aluminum or copper, enabling the cold plate to readily conduct heat generated by the devices away from the devices and to the environment. Generally, heat is conducted by the cold plate to a structure which is designed to transfer the heat to the surrounding air or a liquid via conduction and convection.

A disadvantage with prior art cold plates is that heat transfer from a power electronic device is diminished to some degree because the heat must travel through the base plate of the housing in which the device is enclosed and across the interface between the base plate and the cold plate, before it reaches the cold plate. Heat transfer across the base plate-cold plate interface is highly dependent on the intimacy of the mating surfaces, which in turn is dependent on the flatness of the mating surfaces and the contact pressure generated by the fastener which secures the device to the cold plate. As a result, localized hot spots can occur in the base plate and cold plate, and the power electronic device is subject to higher operating temperatures. To mitigate this effect, larger and thicker base plates are often utilized to better distribute the heat across the base plate-cold plate interface. Thicker cold plates may also be necessary to provide a greater heatsink mass, particularly where more than one power electronic device is mounted to a single cold plate. Unfortunately, the additional weight resulting from increased base plate and cold plate thicknesses is often undesirable, particularly for applications within the automotive and aerospace industries. In addition, thicker cold plates also increase the thermal resistance, thus elevating the operating temperature of the electronics.

Transfer of heat to a fluid flowing through the cold plate is also known. Again, a thermally conductive metal cold plate is typically used, but with one or more passages being formed within the cold plate. As before, heat is conducted from the devices and to the environment via a cooling fluid flowing through the passages. Though enhanced heat transfer is possible with fluid-cooled cold plates, such cold plates share the same disadvantage noted above with the more conventional prior art cold plates. Specifically, heat transfer from the power electronic device is diminished because heat must travel through the base plate of the device and across the interface between the base plate and the cold plate before it reaches the cold plate. Consequently, power electronic devices cooled by fluid-cooled cold plates are also subject to higher operating temperatures.

Other disadvantages of the current fluid cooled cold plates are their effectiveness in cooling and their difficulty to manufacture. Currently, these fluid cooled cold plates typically come in two varieties. The first utilizes channels cut out of a base plate into which tubing, usually copper tubing, is placed. A thermally conductive epoxy is then laid on top of the tubing to hold it in place and to provide a thermal interface between the tube and the base plate. Cooling fluid is then introduced into the tubing to take the heat away from the electronic component. Utilizing the copper tubing allows the plate itself to be manufactured from aluminum which allows for reduced weight and easier manufacturing, but the heat transfer from the liquid through the tubing, the epoxy and into the device itself is not optimal.

Another technique utilizes a base plate made of copper or other suitable material into which channels are drilled for the flow of the cooling liquid. This type of base plate also has several disadvantages. Because the fluid is flowing through the plate itself, the material, such as copper, is often heavy and results in a base plate of significant weight. In addition, the channels often must be drilled from the edge and require that the holes then be brazed so as to create a sealed inner chamber. Another disadvantage is that these holes often turn at straight 90 degree angles due to the difficulty, if not impossibility, of drilling curved corners. This type of channel results in diminished flow capabilities. In addition, similar to the base plate utilizing copper tubing, the cooling capability of the heatsink must be transferred through the base plate and then into the electronic device itself.

SUMMARY OF THE INVENTION

In accordance with the invention, a cold plate for cooling electronic components comprising a base having a top surface onto which at least one electronic component is to be placed; a cooling well formed in the top of the base and open at the top; a feed channel formed in the base for accepting a cooling fluid to be introduced to the cooling well; a drain channel formed in the base through which the cooling fluid is to be carried away from the cooling well; a cooling well inlet formed in the cooling well and in communication with the feed channel; and a cooling well outlet formed in the cooling well opposite the cooling well inlet and in communication with the drain channel; wherein the feed drain channel is sufficiently large relative to the size and flow characteristics of the well and cooling well inlets and outlets such that when the cooling fluid flows through the cooling device, the pressure drop across the feed channel is substantially less than the pressure drop across the well.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
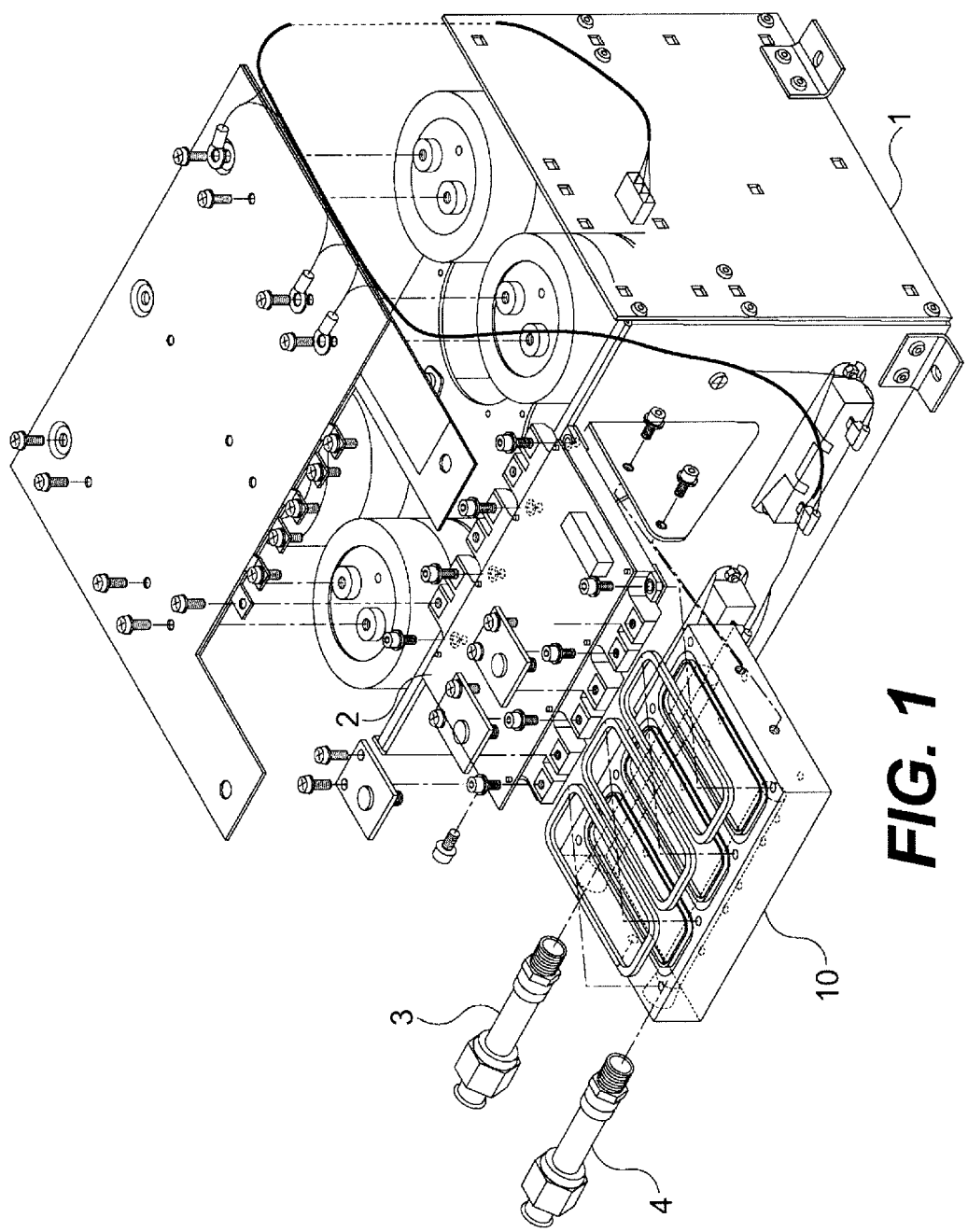
FIG. 1 is a three dimensional exploded view of a typical variable speed induction motor drive system including a cold plate of the present invention

FIG. 1 shows a variable speed induction motor drive 1 with a plurality of switches 2 that are placed over a cold plate 10. Although such a drive can be used to provide desired power to motors for different applications, in a preferred embodiment the drive 1 is used to drive an induction motor in an HVAC system. For example, such a motor may drive a compressor of a chiller system.

Figure 7:
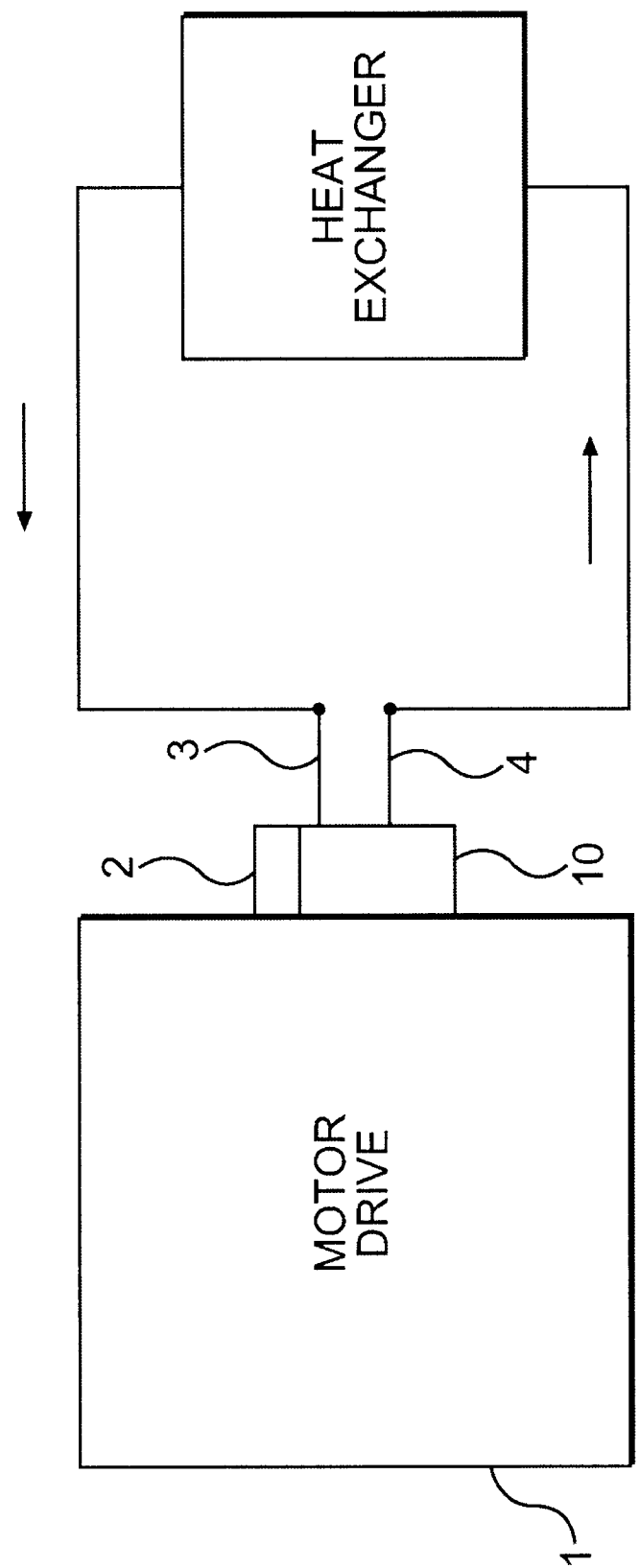
FIG. 7 is illustrates schematically the cold plate of the present invention connected to a cooling system with a heat exchanger.

Switches 2 of the motor drive 1 are depicted as an EUPEC module containing 3 IGBT's, but other semiconductor devices or other electronic components that require cooling for optimal operation could be cooled with this cold plate. Cooling fluid pipes 3, 4 are connected to inlet channel 12 and outlet channel 13, respectively to introduce cooling fluid into cold plate 10. Pipes 3 and 4 are connected to a cooling system as shown in FIG. 7, that provides a continuous flow of cooling fluid to cold plate 10. A cooling fluid such as cooled water, is applied to pipe 3, flows through the cold plate, as described below, and flows out through pipe 4.

A variety of different cooling fluids, including water and known refrigerants can be introduced to the cold plate and used to cool the electronic components. In addition, a variety of different cooling system, such as known heat exchangers, can be used to cool the cooling fluid that is applied to and exits from the cold plate.

In a preferred embodiment and application of the cold plate of the present invention, the cold plate cools at least three electronic switches used to power an induction motor of an HVAC system. The electronic switches, either individually or as a unit, are fixed to the cold plate in a sealed relationship. The cooling fluid applied to the cold plate is preferably water that flows through the cold plate and a heat exchanger in a closed loop as shown in FIG. 7. The heat exchanger cools the water before it is reintroduced to the cold plate. Preferably, the heat exchanger is a shell and tube type heat exchanger where water from a cooling tower of the HVAC system is used to cool the water applied to the cold plate.

Figure 2:
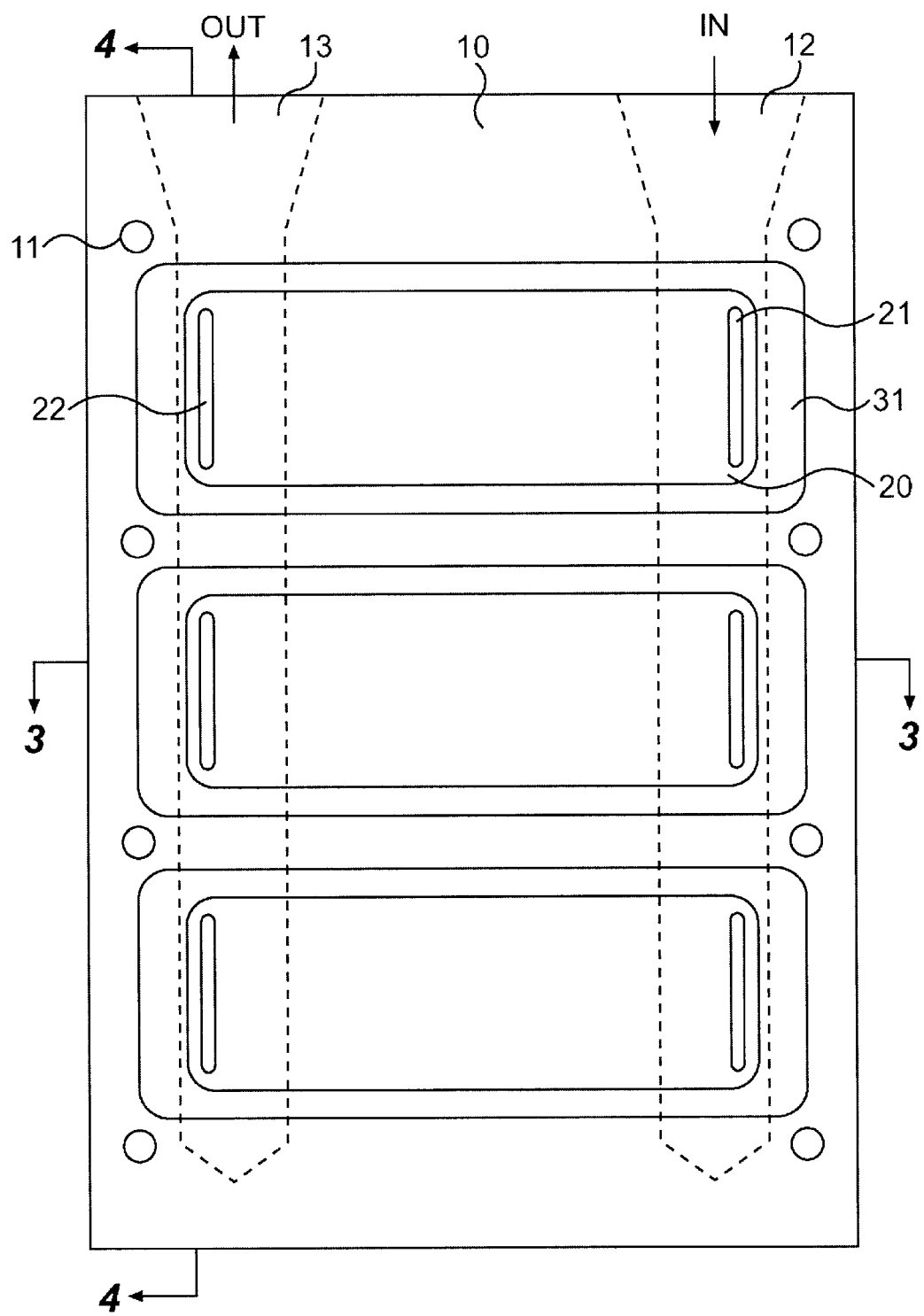
FIG. 2 is a plan view of the cold plate according to the present invention.

As seen in FIG. 2, the cold plate 10 is provided upon which an electronic component or module, preferably including several high speed switches, may be mounted. The cold plate shown in FIG. 2 has mounting holes 11. These holes can be threaded, to receive screws or bolts that engage the electronic component and hold it in place. Although the present invention is shown using mounting holes to secure an electronic component to the base plate, other fastening devices known in the art could be used to fasten the electrical component to the cold plate. By means of example only, the component can be fixed to or positioned on the cold plate by clamping devices, adhesives, welds, etc.

Machined or otherwise formed in cold plate 10 are two main fluid channels 12 and 13, whereby a cooling fluid may be introduced into the plate via feed channel 12 and may exit the plate via drain channel 13. In the illustrated embodiment, these channels are relatively large, cylindrical channels that extend along the length of the cold plate. The channels are sized and designed to have a relatively low pressure drop along their lengths.

At the top of the cold plate are found a series of concave wells 20. In the preferred embodiment, wells 20 are surrounded by an o-ring groove 31 into which an o-ring may be placed. The electronic devices to be cooled are then positioned in place over the wells and fastened via mounting holes 11, or other devices or means, whereby a water tight seal is created between the base of the device and cold plate 10. Preferably, there is a individual well for each individual electronic switch or device to be cooled. The electronic device preferably is positioned directly over the well, so that its bottom is placed in direct contact with the cooling fluid.

The wells preferably have a width and length, and shape, designed to match the width, length, and shape of the electronic component to be cooled. For example, in an HVAC application where the electronic components are switches, the wells have a width of approximately 1.5 inches and a length of 3 inches. Cooling fluid enters a well from feed channel 12 through an inlet port 21 formed in the well, flows through the well, and then exits out outlet port 22 and into outlet channel 13. These channels in turn are connected to a heat exchanger for cooling the cooling fluid that exits channel 13.

The cold plate, and its components are designed to provide optimum heat transfer between the cooling fluid and the electronic components, in an efficient and cost effective manner. It appears that optimum results are achieved with wells having a depth within the range of 0.02 to 0.20 inches, coupled with a hydraulic diameter between 0.05 and 0.20 inches, and with inlets that are 90° nozzles, applying the cooling fluid at an angle of approximately 90° against the surface of the electronic component placed over the well. The hydraulic diameter of the wells is thus defined generally by the following equation: Hydraulic Diameter=4×Cross-sectional area/(2×Well Depth+2×Well Width). The nozzles preferably are located at the end of a well, as shown in the Figures, so that the cooling fluid in effect bounces off both the surface of the electronic component and the walls of the well adjacent the nozzle.

The nozzles promote a high degree of turbulence due to the impingement if cooling fluid on the surface of the electronic component. This turbulence is sustained by the optimal selection of the well depth and hydraulic diameter. A shallower well depth or smaller hydraulic diameter would tend to re-laminarize the flow, thereby decreasing some of the enhancement in heat transfer. On the other hand, a deeper well depth or larger hydraulic diameter would tend to decrease the heat transfer enhancement due to a reduction in the velocity of the fluid adjacent to the surface.

The cold plate and its components are also preferably designed such that the pressure drop across the length of the inlet channel 12 is substantially less than the pressure drop across the wells. This is achieved by increasing the size of at least the inlet channel, relative to the size, shape, and flow characteristics of the well and its inlets and outlets, to achieve this relative relationship. Preferably the pressure drop across the length of inlet channel is no greater than $1/10^{th}$ of the pressure drop across the individual wells. Preferably, each of the wells has the same size, shape, and fluid flow characteristics.

Figure 6:
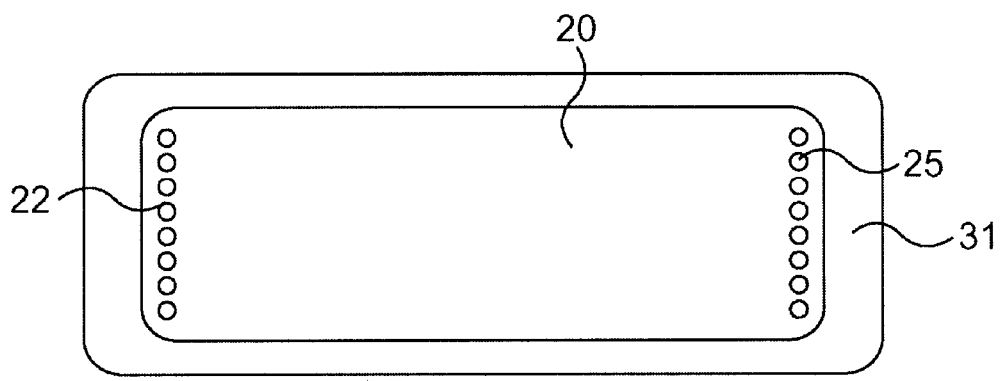
FIG. 6 is a plan view showing a second embodiment of the well and O-ring of the cold plate of FIG. 2.

As shown in the figures, in a preferred embodiment of the invention, the inlets and outlets of the wells are in the form of elongated slots. These inlet slots have a width, length, and a depth. The resultant slots are designed to serve as nozzles that direct cooling fluid against the bottom surface of the electronic components. Ports 21 and 22 are sufficiently small in comparison to channels 12 and 13 such that no appreciable pressure drop is measurable across the channel 13 as cooling liquid flows into each of the wells 20. As shown in FIG. 6, another embodiment of the inlet and outlet ports is shown whereby the inlet and outlet are actually a plurality of openings 25 formed into either end of the well 20.

The channels 12 and 13 are designed to provide substantially equal pressure along the entire length of both channels, with the result that each well 20 "sees" the same inlet pressure and pressure differential and is capable of having an equal flow and thus an equal cooling capability. The use of channels having these desired characteristics minimizes, and preferably avoids, the problem of reduced flow in each subsequent well that occurs in prior art devices.

As an example, when the wells have a width of approximately 1.291 inches, a length of approximately 4.033 inches, and a depth of approximately 0.05 inches; and when the cold plate includes three wells, it has been found that channels 12 and 13 with a diameter of 0.563 inches provides the desired flow and pressure drop characteristics. In that example, the ports 21 and 22 preferably extend along substantially the entire width of the wells and the ports have a nozzle width of approximately 0.094 inches, a length of approximately 0.906 inches, and a depth of at least 0.125 inches.

Figure 3:
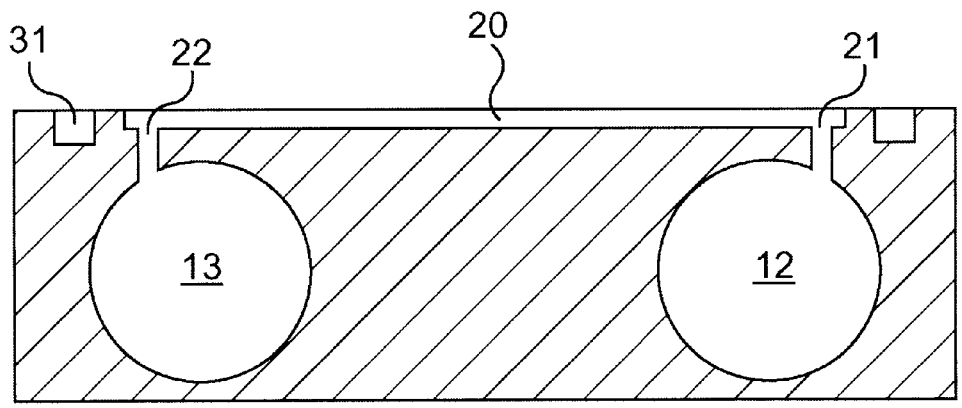
FIG. 3 is cross-sectional view of the cold plate of FIG. 2 through line A—A.
Figure 5:
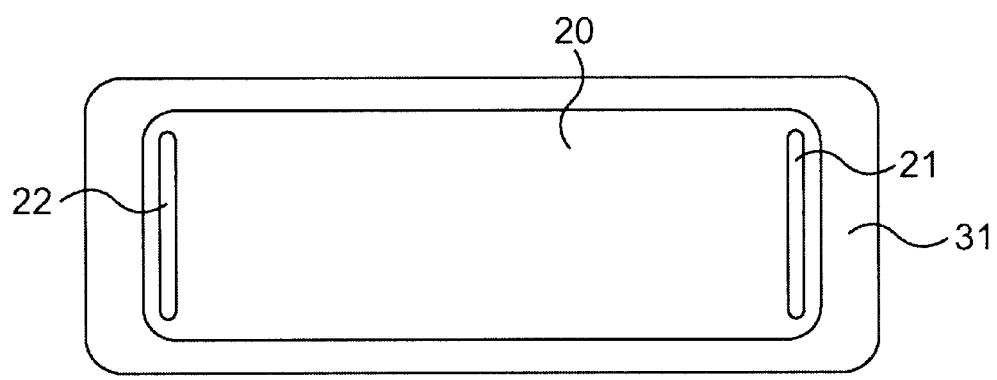
FIG. 5 is a plan view showing the well and O-ring of the cold plate of FIG. 2.
Figure 4:
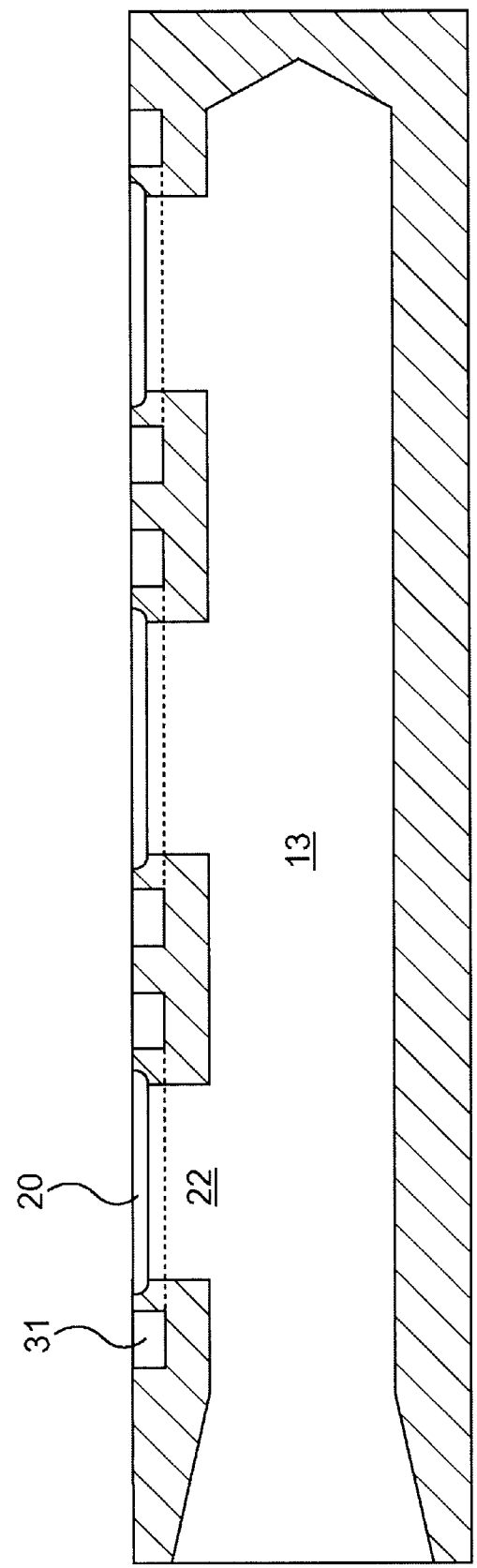
FIG. 4 is a cross-sectional view of the cold plate of FIG. 2 through line B—B.

As shown in part in FIG. 3, the ports preferably are formed as elongated slots that extend from the bottom of the well downward to the channels 12 and 13. These slots preferably are perpendicular to the surface of the cold plate. This combination achieves a more turbulent flow that enhances the heat transfer without significantly impacting pressure drop. The uncomplicated shape of the wells, inlets and channels provides for much easier manufacturing than is associated with other related devices that have wells of varying depths or require the use of obstacles placed in the flow path to enhance the turbulent flow.

Also, by connecting each well 20 directly to the inlet 13 as opposed to having the cooling fluid flow in series from the first well to the last, each well is fed with fresh coolant which maximizes the cooling capability of all of the wells. Similar prior art devices utilize a single path for the coolant such that by the time the coolant reaches subsequent wells, each prior well has transferred heat into the coolant. By the time the coolant reaches the last well in a series such as this, the cooling capability of the coolant is greatly diminished.

Although one of ordinary skill in the art would understand that this cold plate could be made from any of a number of suitable materials, a material such as aluminum would be preferable so as to minimize the weight of the cold plate. In addition, it would be desirable to anodize the portions of the cold plate that come in contact with the coolant so as to reduce the possibility for corrosion. Another desirable material for this cooling device would be copper.

It is also anticipated that additional electronic components could be affixed to the cold plate on the surface opposite the one with the open wells. This would provide cooling to those components in a fashion similar to prior art devices by transferring the heat through the component to the cold plate and then to the liquid. This configuration allows for a very compact overall package.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A cold plate for cooling electronic components comprising:

a base having a top surface onto which at least one electronic component is to be placed;

a cooling well formed in the top surface of the base and open at the top;

a feed channel formed in the base for accepting a cooling fluid to be introduced to the cooling well;

a drain channel formed in the base through which the cooling fluid is to be carried away from the cooling well;

a cooling well inlet formed in the cooling well and in communication with the feed channel; and a cooling well outlet formed in the cooling well opposite the cooling well inlet and in communication with the drain channel;

wherein the feed channel is sufficiently large relative to the size and flow characteristics of the well and cooling well inlets and outlets such that when the cooling fluid flows through the cooling device, the pressure drop across the feed channel is substantially less than the pressure drop across the well.

2. The cold plate of claim 1 wherein the cold plate includes a plurality of wells spaced along the lengths of the feed channel and the drain channel, each of the wells being sized and shaped to cool an electronic component, or a subpart thereof.

3. The cold plate of claim 1 wherein the pressure drop across the feed channel is no more than one-seventh of the pressure drop across the well.

4. The cold plate of claim 1 wherein the pressure drop across the feed channel is no greater than one-tenth of the pressure drop across the well.

5. The cold plate of claim 1 wherein the hydraulic diameter of each of the wells is between 0.05 and 0.20 inches.

6. The cold plate of claim 2 wherein the depth of each of the cooling wells is within the range of 0.020 and 0.20 inches.

7. The cold plate of claim 6 wherein the pressure drop across each of the wells is approximately the same and wherein the pressure drop across the feed channel is no greater than one-seventh of the pressure drop across the wells.

8. The cold plate of claim 6 wherein each of the cooling well inlets comprises a nozzle designed to direct cooling fluid directly against the surface of the electronic component to be placed over the respective cooling well.

9. The cold plate of claim 8 wherein the well inlets are nozzles that direct the cooling fluid at an angle of approximately 90° to the surface of the electronic component.

10. The cold plate of claim 9 wherein each of the well inlets are positioned at an end of the respective cooling well proximate the feed channel, such that cooling fluid from the inlets will be directed against the surface of the electronic component and will also bounce off of an end wall of the cooling well and toward the cooling well outlet.

11. The cold plate of claim 10 wherein each of the cooling well inlets are elongated slits that extend substantially the entire length of the side of the cooling well closest to the feed channel.

12. The cold plate of claim 11 wherein the cooling well outlets are elongated slits formed at the end of the cooling well opposite the location of the cooling well inlets.

13. The cold plate of claim 2 further comprising a mechanical system for connecting the electronic components to the cold plate in a sealed relationship.

14. The cold plate of claim 13 wherein the mechanical system includes a plurality of apertures in the cold plate and a plurality of fasteners to engage the apertures and an electronic component.

15. The cold plate of claim 14, further comprising an o-ring channel formed about the perimeter of each of the cooling wells into which an o-ring may be placed.

16. The cold plate claim 2, wherein the cold plate includes at least three cooling wells and associated cooling well inlets and outlets.

17. The cold plate of claim 2, wherein the cold plate is made of aluminum.

18. The cold plate of claim 2, wherein all portions of the cooling plate that would come in contact with the cooling fluid are anodized.

19. The cold plate of claim 2, wherein the cooling device is made of copper.

20. The cold plate of claim 9, wherein a flow of coolant through the feed channel is substantially perpendicular to a flow of coolant through the plurality of cooling wells.

21. The cold plate of claim 9, wherein each of the plurality of cooling wells is provided with rounded corners at the base of the well and are substantially the same depth across the remaining portion of the well.

22. The cold plate of claim 2, wherein the cooling inlets and outlets are narrow elongated slits that extend substantially the entire length of the side of the well.

23. The cold plate of claim 2, wherein the cooling inlets and outlets comprise a series of holes formed into the side of the well closest to the feed channel and drain channel respectively.

24. The cold plate of claim 2 wherein the cooling fluid is water.

25. A cold plate for cooling high speed electronic switches comprising:
   a base having a top surface onto which at least three high speed electronic switches are to be placed;
   at least three cooling wells formed in the top surface of the base and open at the top, wherein each well receives a high speed electronic switch;
   a feed channel formed in the base for accepting a cooling fluid to be introduced to the cooling well;
   a drain channel formed in the base through which the cooling fluid is to be carried away from the cooling well;
   a cooling well inlet formed in the cooling well and in communication with the feed channel; and
   a cooling well outlet formed in the cooling well opposite the cooling well inlet and in communication with the drain channel.

26. The cold plate of claim 25, wherein the well inlets are nozzles designed to direct cooling fluid directly against the surface of the electronic switches, at an angle of approximately 90°.

27. The cold plate of claim 25, wherein the cooling fluid is cooled in a closed-loop system using a heat exchanger.

28. The cold plate of claim 25, wherein the feed and drain channels are sufficiently large relative to the size and flow characteristics of the well and cooling well inlets and outlets such that when the cooling fluid flows through the cooling device, the pressure drop across the feed channel is substantially less than the pressure drop across the well.

* * * * *